(12) United States Patent
Wu

(10) Patent No.: US 7,554,840 B2
(45) Date of Patent: Jun. 30, 2009

(54) SEMICONDUCTOR DEVICE AND FABRICATION THEREOF

(75) Inventor: Kou-Cheng Wu, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 60 days.

(21) Appl. No.: 11/437,744

(22) Filed: May 22, 2006

(65) Prior Publication Data

US 2007/0278553 A1 Dec. 6, 2007

(51) Int. Cl.
*G11C 11/34* (2006.01)

(52) U.S. Cl. ............... 365/185.01; 365/185.28; 365/185.26; 365/185.12; 257/317; 257/318; 257/315; 257/319

(58) Field of Classification Search ............ 365/185.28, 365/185.12, 185.01, 185.26; 257/317, 318, 257/315, 319
See application file for complete search history.

(56) References Cited

U.S. PATENT DOCUMENTS

| | | | | |
|---|---|---|---|---|
| 4,257,056 A | * | 3/1981 | Shum | 257/317 |
| 4,974,051 A | * | 11/1990 | Matloubian et al. | 257/347 |
| 5,008,856 A | * | 4/1991 | Iwahashi | 365/185.17 |
| 5,099,297 A | * | 3/1992 | Hazani | 257/319 |
| 5,231,299 A | * | 7/1993 | Ning et al. | 257/316 |
| 5,412,600 A | * | 5/1995 | Nakajima | 365/185.17 |
| 5,414,693 A | * | 5/1995 | Ma et al. | 257/315 |
| 5,432,740 A | * | 7/1995 | D'Arrigo et al. | 365/185.27 |
| 5,614,747 A | * | 3/1997 | Ahn et al. | 257/316 |
| 2002/0192859 A1 | * | 12/2002 | Akram | 438/106 |
| 2006/0192244 A1 | * | 8/2006 | Shone | 257/315 |

OTHER PUBLICATIONS

A. Scheibe et al., Technology of a New n-Channel One-Transistor EAROM Cell Called SIMOS, May 1977, IEEE Transactions On Electron Devices, vol. ED-24, No. 5, pp. 1, 2, 4.*

* cited by examiner

*Primary Examiner*—Hoai V Ho
*Assistant Examiner*—Fernando N Hidalgo
(74) *Attorney, Agent, or Firm*—Birch, Stewart, Kolasch & Birch, LLP

(57) ABSTRACT

A memory device is disclosed. A floating gate is disposed overlying a substrate. A tunneling dielectric layer is interposed between the floating gate and the substrate. An inter poly dielectric layer is disposed overlying the floating gate and the substrate. A word line is disposed overlying the floating gate, extending in a row direction. A bit line is disposed in the substrate, extending in a column direction, wherein the bit line is partially overlapped by the floating gate and the word line.

5 Claims, 6 Drawing Sheets

SEMICONDUCTOR DEVICE AND FABRICATION THEREOF

BACKGROUND OF THE INVENTION

1. Field of the Invention

The invention relates to a semiconductor device and fabrications thereof, and more particularly to a memory device and fabrications thereof.

2. Description of the Related Art

Non-volatile memory, such as flash memory, stores data regardless of electrical power supplied, and reads and writes data by controlling a threshold voltage of a control gate. One of the advantages of flash memory is its capacity for block-by-block memory erasure. Furthermore, the speed of memory erasure is fast, and normally takes just 1 to 2 seconds for the complete removal of an entire block of memory. Therefore, in recent years, it is widely applied for consumer electronics devices, such as digital cameras, mobile phones, personal stereos, and laptops.

FIG. 1 is a cross-section showing a conventional split gate flash memory cell. The memory cell includes a silicon substrate 100 having a source region S and a drain region D. A source line 110 is disposed on the source region S. A floating gate 104 and silicon oxide layers 102, and 106 are disposed over the substrate 100 outside the source line 110, and the floating gate 104 is insulated from the source line 110 by a spacer 108. A control gate 114 with an "arc" profile formed by a spacer method is disposed over the substrate 100 outside the floating gate 104 and insulated by a inter poly oxide 113 and the high voltage oxide 190. In addition, the bit line 120 disposed in the contact hole 119 is insulated from the control gate (word line) 114 by the interlayer dielectric (ILD) 118 and the spacer 116.

This split gate flash memory device, however, suffers some drawbacks when scaled down to small dimensions. For example, a source junction S of the split gate flash memory device requires high breakdown voltage (more than 10 V). Further, the split gate flash memory device also suffers large lateral diffusion at the source junction S, large cell size, high programming current, process complexity creating a sharp corner for the floating gate and low endurance. In addition, the inter poly oxide 113 and the high voltage oxide 190 cannot be independently optimized.

BRIEF SUMMARY OF THE INVENTION

A detailed description is given in the following embodiments with reference to the accompanying drawings. These and other problems are generally solved or circumvented, and technical advantages are generally achieved, by preferred illustrative embodiments of the present invention, which provide a semiconductor device.

The invention provides a memory device. An exemplary embodiment of the memory device comprises a floating gate disposed in a memory array overlying a substrate comprising an active area. Preferably, the memory array is disposed on the active area. A tunneling dielectric layer is interposed between the floating gate and the substrate. An inter poly dielectric layer is disposed overlying the floating gate and the substrate. A word line is disposed overlying the floating gate, extending in a row direction. A bit line is disposed in the substrate, extending in a column direction, wherein the bit line is partially overlapped with the floating gate and the word line.

In some embodiments of the memory device, a plurality of word lines and bit lines define a plurality of memory cells. Each memory cell comprises a select transistor, comprising a first electrode, a second electrode and a select gate, wherein the select gate is coupled to the word lines, and the first electrode is coupled to the bit lines, and a stack transistor coupled to the second electrode of the select transistor, wherein the stack transistor comprises a floating gate, and the floating gate completely overlaps with one of the word lines to form the stack transistor.

The invention provides a method for forming a memory device. A tunneling dielectric layer is formed overlying the substrate. A first conductive layer is formed overlying the tunneling dielectric layer. The first conductive layer and the tunneling dielectric layer are patterned to form a conductive line. An inter poly dielectric layer is formed overlying the conductive line and the substrate. A second conductive layer is formed overlying the inter poly dielectric layer. The second conductive layer, the inter poly dielectric layer and the conductive line are patterned to form a word line and a floating gate. The substrate is implanted to form at least one bit line.

The invention provides a memory device. An exemplary embodiment of the memory device comprises a floating gate is disposed overlying a substrate. An inter poly dielectric layer is disposed overlying the floating gate and the substrate. A word line is disposed overlying the floating gate, extending in a row direction. A bit line is disposed in the substrate, extending in a column direction, wherein the bit line is partially overlapped by the floating gate and the word line. A source line is disposed in the substrate, extending in a column direction.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE INVENTION

Figure 1:
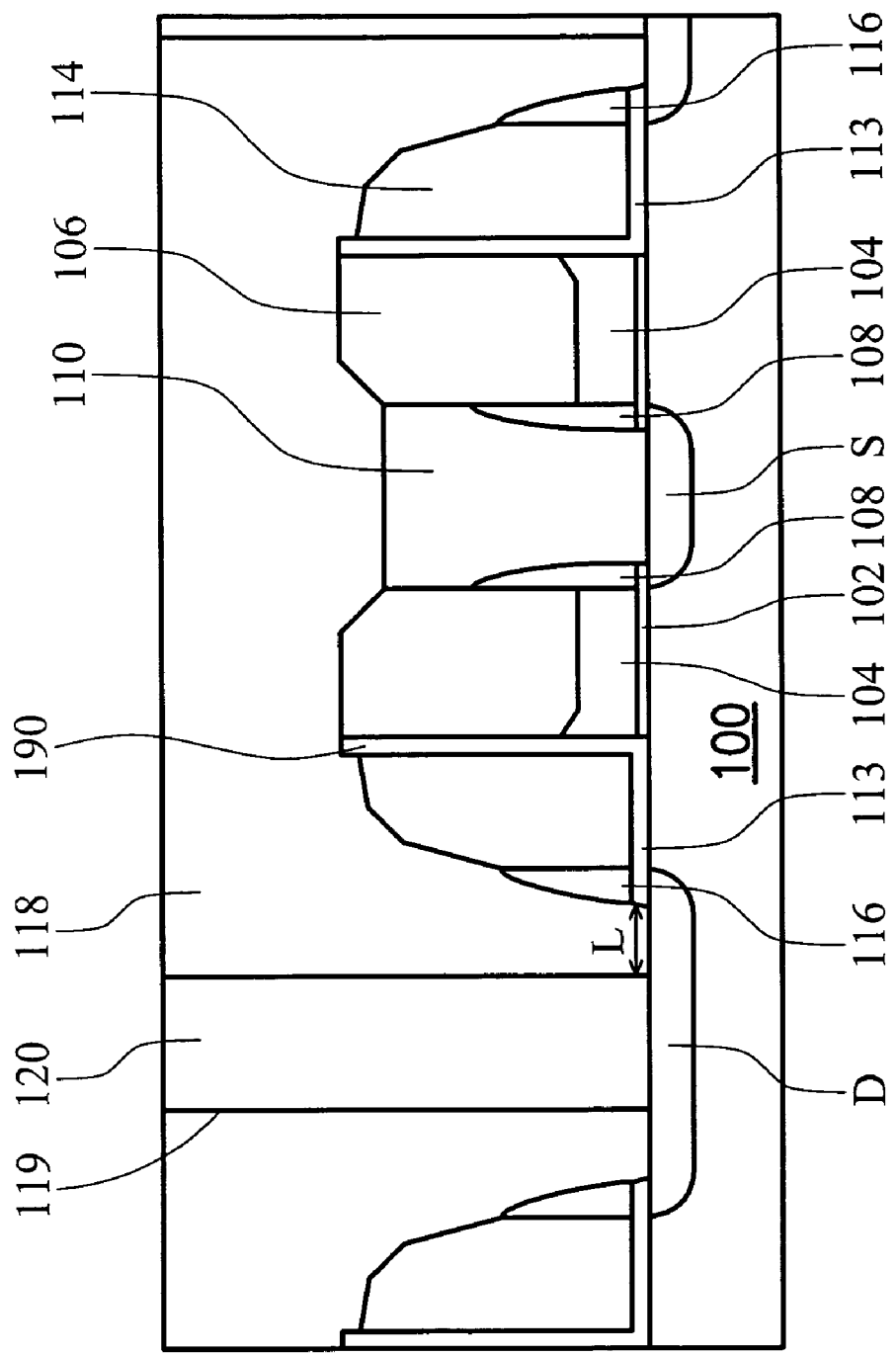
FIG. 1 is a cross section showing a conventional split gate flash memory cell.

The following description is of the best-contemplated mode of carrying out the invention. This description is made for the purpose of illustrating the general principles of the invention and should not be taken in a limiting sense. The scope of the invention is best determined by reference to the appended claims. Embodiments of the invention, which provides a semiconductor device, will be described in greater detail by referring to the drawings that accompany the invention. It is noted that in the accompanying drawings, like and/or corresponding elements are referred to by like reference numerals. In addition, in embodiments of the invention, only the semiconductor device is shown. The semiconductor device can further be packaged by a package structure.

Figure 2A:
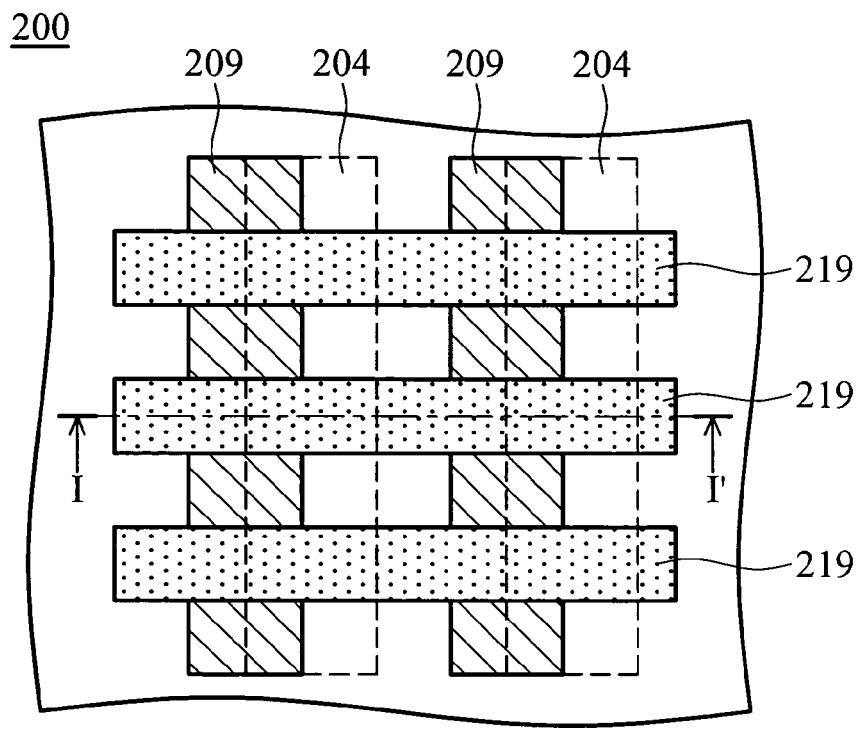
FIG. 2A~2B shows an intermediate plan view of a flash memory device of an embodiment of the invention.
Figure 2B:
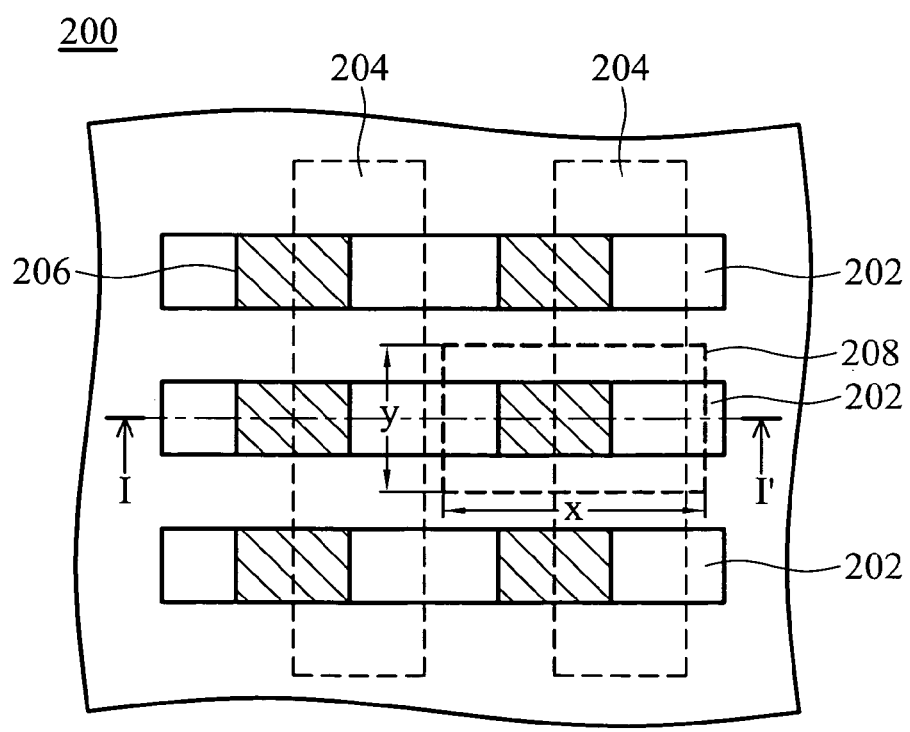
Figure 3A:
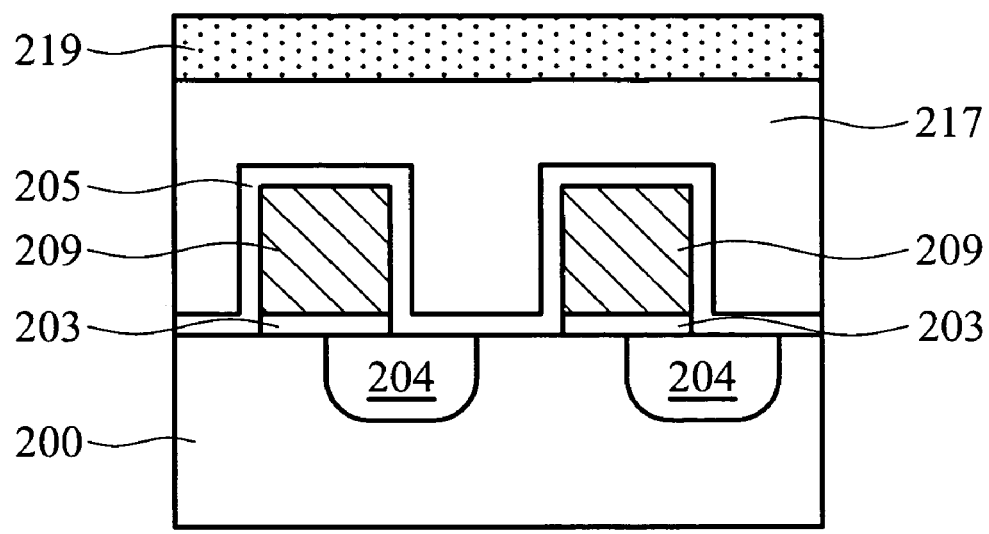
FIG. 3A shows a cross section along line I-I' of FIG. 2A.
Figure 3B:
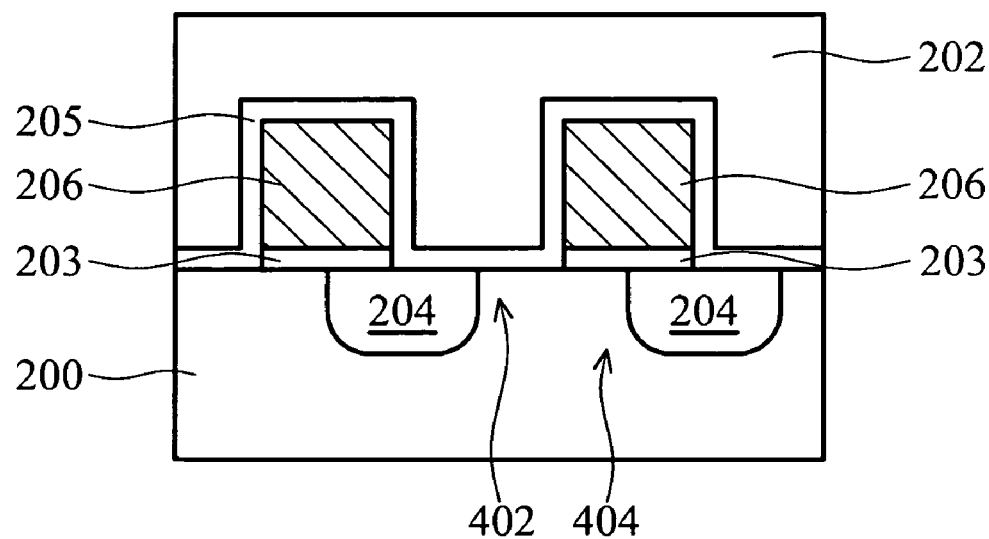
FIG. 3B shows a cross section along line I-I' of FIG. 2B.

FIG. 2A~2B shows an intermediate plan view of a flash memory device of an embodiment of the invention. FIG. 3A shows a cross section along line I-I' of FIG. 2A. FIG. 3B shows a-cross section along line I-I' of FIG. 2B. Referring to FIG. 2A and FIG. 3A, a substrate 200 is provided. The substrate 200 may comprise silicon, gallium arsenide, gallium nitride, strained silicon, silicon germanium, silicon carbide, diamond, an epitaxy layer, and/or other materials. Preferably, the substrate 200 is a silicon substrate.

Next, a tunneling dielectric layer 203, such as silicon oxide, is blanketly formed on the substrate 200. A first conductive layer (not shown), such as polysilicon, is blanketly deposited on the tunneling dielectric layer 203. Thereafter, the first conductive layer and the tunneling dielectric layer 203 are patterned by typical lithography and etching to form a plurality of first conductive lines extending in a column direction.

Next, the substrate 200 is implanted by, for example tilt ion implantation, to form a plurality of bit lines 204 parallel to the first conductive lines 209. In an embodiment of the invention, the bit lines 204 are doped regions, such as N+ doped regions, extending in a column direction.

Thereafter, an inter poly dielectric layer 205 is blanketly formed on the first conductive lines 209 and the substrate 200. The inter poly dielectric layer 205 can be silicon oxide, silicon nitride, silicon oxynitride or stack layers thereof. Preferably, the inter poly dielectric layer 205 is an oxide-nitride-oxide layer, which can be called ONO layer for short. A second conductive layer 217, such as polysilicon, is blanketly deposited on the inter poly dielectric layer.

Next, a patterned photoresist layer 219 is coated on an area, predetermined to form word lines, overlying the second conductive layer 217. An etching process is utilized using the patterned photoresist layer 219 as a mask, wherein the conductive layer 217 and the underlying first conductive lines 205 are etched through.

Thus, as shown in FIG. 2B and FIG. 3B, the word lines 202 extending in the row direction, perpendicular to the conductive lines and the bit lines 204, are formed and the floating gates 206 thereunder are further formed by self-aligned etching.

Referring to FIG. 2B and FIG. 3B, a plurality of word lines 202 extend in a row direction over a substrate 200. A plurality of bit lines 204 disposed in the substrate 200 extends in a column direction under the word lines 202. A plurality of floating gates 206 are interposed between the perpendicular word lines and bit lines. The floating gates 206 are partially overlapped by the bit lines 204 respectively. Note that the cell size is smaller than conventional split gate flash memory. For example, the horizontal pitch x of one memory cell 208 can be 4.5F, the vertical pitch y can be 2F. Thus, the cell 208 size can be 9F2.

In a unit cell, a portion of the word line 202 adjacent to side of the floating gate 206, and the inter poly dielectric layer 205 thereunder constitute a select transistor. Another portion of the word line 202 directly overlying the floating gate 206, the inter poly dielectric layer 205 and the floating gate 206 constitute a stack transistor.

Figure 4:
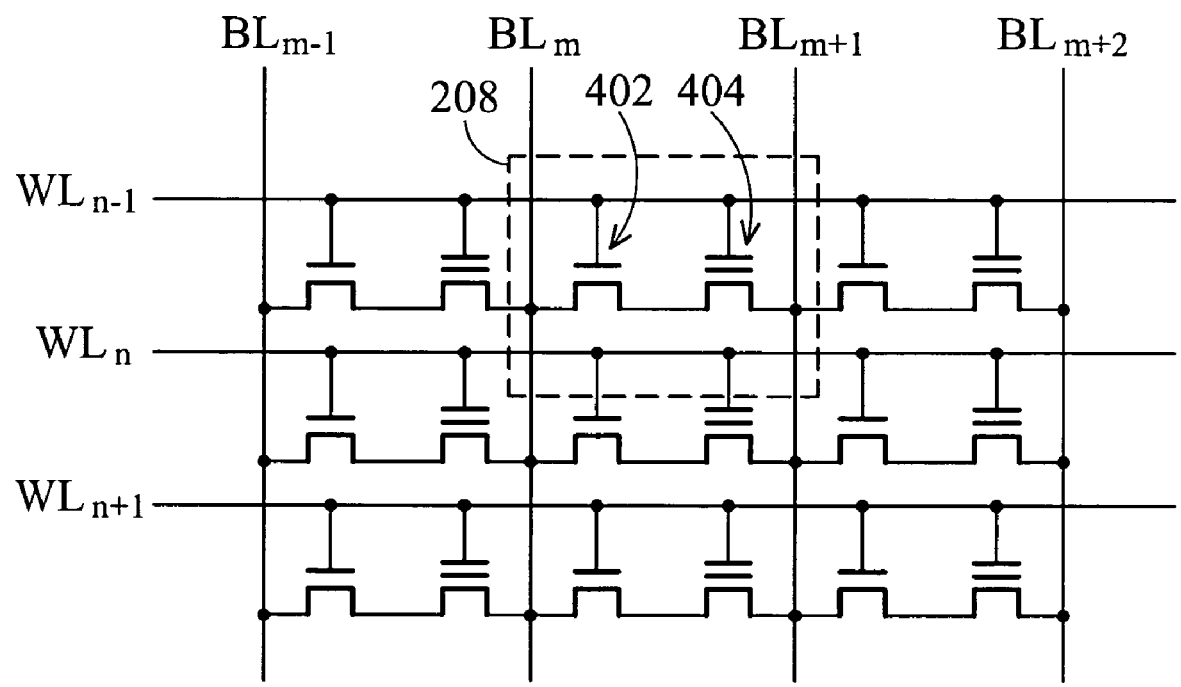
FIG. 4 is a circuit diagram of a memory device of an embodiment of the invention.

FIG. 4 is a circuit diagram of the memory device FIG. 2B. Referring to FIG. 2B, FIG. 3B and FIG. 4, a plurality of word lines WLn−1~WLn+1, corresponding to 202 of FIG. 2B, are perpendicular to a plurality of bit lines BLm−1~BLm+1, corresponding to 204 of FIG. 2B, to define memory cells 208. Each unit cell 208 comprises a select transistor 402 and a stack transistor 404. The select transistor 402 and the stack transistor 404 are connected in series. A drain electrode of the select transistor 402 is coupled to a source electrode of the stack transistor 404. In a single cell, a source electrode of the select transistor 402 is coupled to a bit line BLm, a drain electrode of the stack transistor 404 is coupled to a next bit line BLm+1. Gate electrodes of the select transistor 402 and the stack transistor 404 are coupled to a word line WLn−1.

In a programming operation, the word line WLn−1 is applied with high negative bias, such as −6V~−12V, and the bit line BLm+1 are applied with positive bias, such as 3V~7V. Due to the high negative bias of the word line WLn−1, the floating gate 206 of the stack transistor 404 is strongly coupled to a relative high negative bias. Thus, electrons in the floating gate 206 are drained to the bit line BLm+1 by Fowler-Nordheim (FN) tunneling through the tunneling dielectric layer 203. The memory cell 208 is programmed to low Vt.

In an erasing operation, the word line WLn−1 is applied with high positive bias, such as 10V~20V, and the bit line BLm−1 is ground. Due to the high positive bias of the word line WLn−1, the floating gate 206 of the stack transistor is strongly coupled to a relative high positive bias. Thus, electrons are ejected from the bit line BLm−1 through the tunneling dielectric layer 203 to the floating gate 206. The memory cell is erased to high Vt.

In a reading operation, the word line WLn−1 is positively biased, for example 1.8V is applied to turn on the select transistor 402, and the bit line BLm+1 is also positively biased, for example applying 1V, to read the selected memory cell 208. It is to be noticed that since a bit line is used by two adjacent memory cells, only a half page of the memory cells, such as even or odd memory cells, can be read at one time.

Figure 5A:
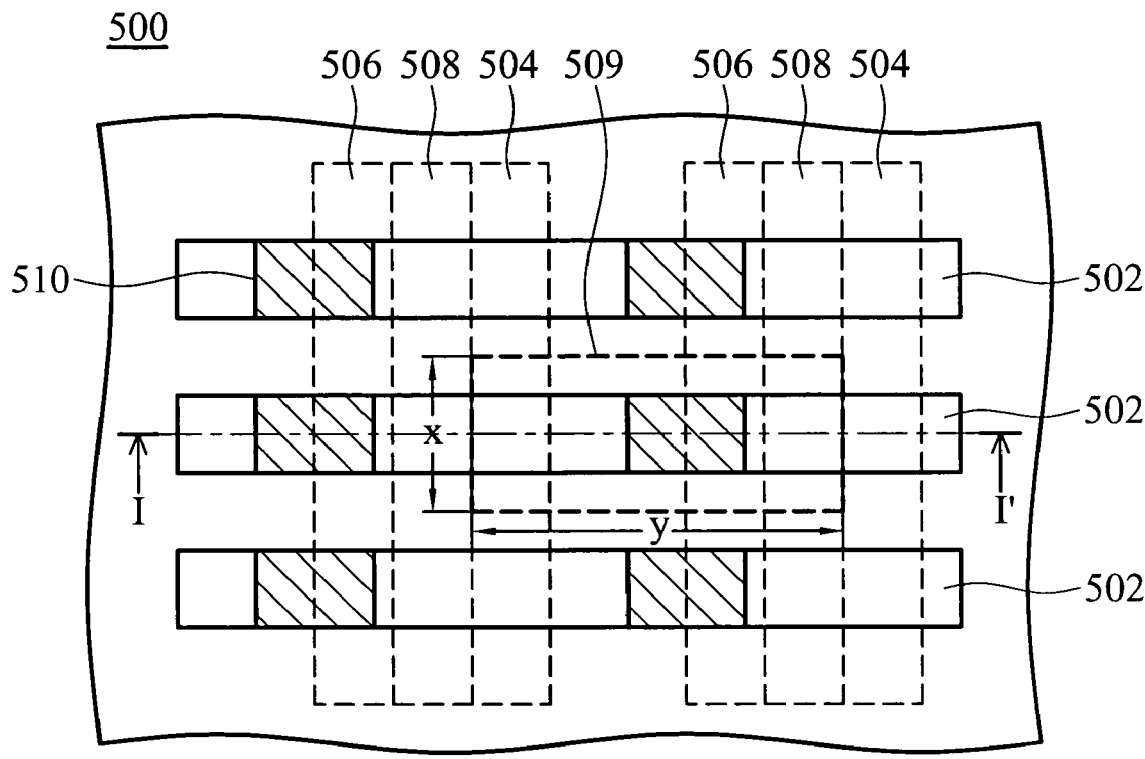
FIG. 5A shows a plan view of a flash memory device of another embodiment of the invention.

FIG. 5A shows a plan view of a flash memory device of another embodiment of the invention. Referring to FIG. 5A, a plurality of word lines 502 extend in a row direction over a substrate 500. A plurality of source lines 504 and bit lines 506 disposed in the substrate 500 extends in a column direction under the word lines 502, in which the source lines 504 and bit lines 506 can be N+ doped region disposed in the substrate 500, and both are separated by a shallow trench isolation 508.

A plurality of floating gates 510 are interposed between the perpendicular word lines 502 and bit lines 506, wherein the floating gates 510 are partially overlapped by the bit lines 506. The cell size is rather larger than the memory device in the embodiment illustrated in FIG. 2B. For example, the horizontal pitch x of one memory cell can be 6F, the vertical pitch y can be 2F, and the cell size can be 12F2.

Figure 5B:
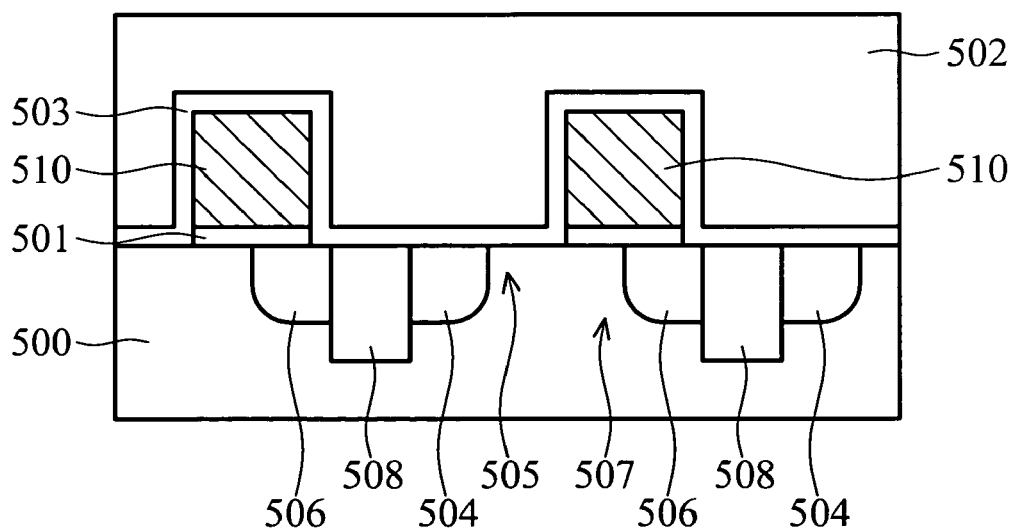
FIG. 5B shows a cross section along line I-I' of FIG. 5A.

FIG. 5B shows a cross section along line I-I' of FIG. 5A. Referring to FIG. 5A and FIG. 5B, a substrate 500, such as silicon substrate, is provided. Next, shallow trench isolations 508 are formed in the substrate 500. A tunneling dielectric layer 501, such as silicon oxide, is blanketly formed on the substrate 500. A first conductive layer (not shown), such as polysilicon, is blanketly deposited on the tunneling dielectric layer. Thereafter, the first conductive layer and the tunneling dielectric layer are patterned by typical lithography and etching to form a plurality of first conductive lines extending in a column direction.

Next, the substrate 500 is implanted by, for example tilt ion implantation, to form a plurality of source lines 504 and bit lines 506 parallel to the first conductive lines. In an embodiment of the invention, the source lines 504 and the bit lines 506 are doped regions, such as N+ doped regions, extending in a column direction. The source lines 504 and the bit lines 506 are separated by the shallow trench isolations 508 therebetween.

Thereafter, an inter poly dielectric layer 503 is blanketly formed on the first conductive lines and the substrate. A second conductive layer (not shown), such as polysilicon, is blanketly deposited on the inter poly dielectric layer 503.

Next, a patterned photoresist layer (not shown) is coated on an area, predetermined to form word lines, overlying the second conductive layer. An etching process is utilized using the patterned photoresist layer as a mask, wherein the conductive layer and the underlying first conductive lines are etched through, thus, forming the word lines 502 extending in the row direction, perpendicular to the conductive lines, the bit lines 506 and the source lines 504, and the floating gates 510 thereunder is formed by self-aligned etching.

It is noticed that in a unit cell, a portion of the word line 502 adjacent to side of the floating gate 510 serve as a control gate. Thus, the select gate and the inter poly dielectric layer 503 thereunder, serving as a gate dielectric layer, constitute a select transistor 505. Another portion of the word line 502 directly overlying the floating gate 510, the inter poly dielectric layer 503 and the floating gate 510 constitute a stack transistor 507.

Figure 5C:
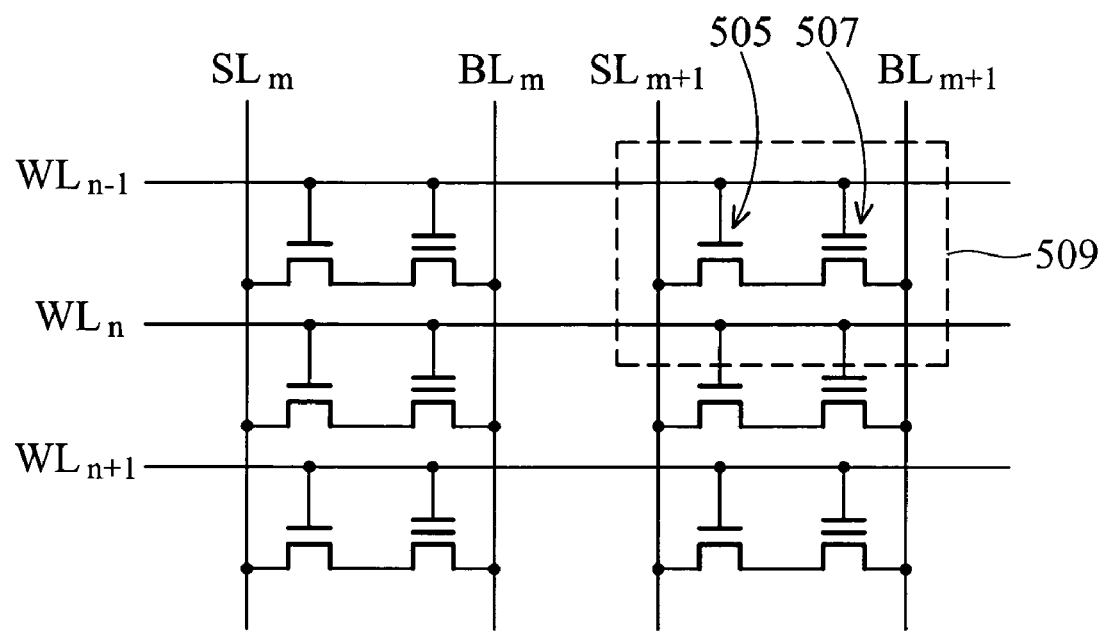
FIG. 5C is a circuit diagram of a memory device of another embodiment of the invention.

FIG. 5C is a circuit diagram of a memory device of an embodiment of the invention. Referring to FIG. 5A, FIG. 5B and FIG. 5C, a plurality of word lines Wn−1~Wn+1, corresponding to 504 in FIG. 5B, are perpendicular to a plurality of source lines SLm~SLm+1, corresponding to 506 in FIG. 5B, and bit lines BLm~BLm+1 to define memory cells. Each unit cell 509 comprises a select transistor 505 and a stack transistor 507. The select transistor 505 and the stack transistor 507 are connected in series. As well, a drain electrode of the select transistor 505 is coupled to a source electrode of the stack transistor 507. In a single cell 509, a source electrode of the select transistor is coupled to a source line SLm+1, a drain electrode of the stack transistor 507 is coupled to a bit line BLm+1. Gate electrodes of the select transistor 505 and the stack transistor 507 are coupled to a word line WLn−1.

The programming and erasing condition of the memory device of this embodiment is similar to the embodiment described in FIG. 4. The difference is that when reading, since one memory cell 509 can use a source line SLm+1 and a bit line BLm+1. Thus, a full page of the memory cells can be read at one time.

Figure 5D:
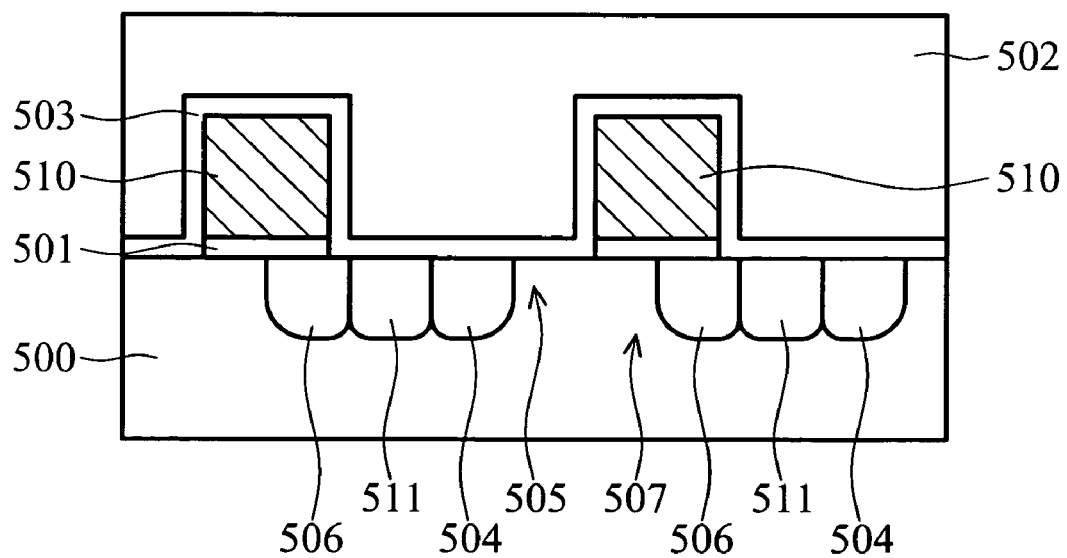
FIG. 5D shows a cross section of a flash memory device of further another embodiment of the invention.

Referring to FIG. 5D, in addition to the shallow trench isolations, the source lines 504 and the bit lines 506 can also be separated by doping regions 511 with a reverse doping type from the source lines 504 and the bit lines 506 to provide a depletion region for isolation. For example, when the source 506 and bit lines 506 are n+ doped, the doping regions 511 can be P+ doped.

Accordingly, a 2-T stack-gate structure with smaller cell size is provided. The memory cells are organized by a contactless array, in which buried bit lines formed in the substrate. The process is relatively simple since the source lines and the bit lines can be formed by self-aligned tilt implanting, and the floating gates can be formed by self-aligned etching.

The invention also provides lower junction break down voltage, reduced over-erase issue due to program to low Vt and erase to high vt, low programming current due to FN tunneling. Sharp corners of floating gates are not required. Further, the bit lines can be supplied different voltage levels, thus parallel multi level cell MLC could be achieved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A programmable memory device, comprising:
a word line, a first bit line, a second bit line and a third bit line defining a first unit cell and a second unit cell connected in series, wherein the first and second unit cells respectively comprise:
a select transistor comprising a select gate connected to the word line; and
a stack transistor comprising a floating gate and a control gate, wherein the control gate is electrically connected to the word line, a drain electrode of the select transistor is electrically connected to a source electrode of the stack transistor,
wherein the first bit line is electrically connected to a source electrode of the select transistor of the first unit cell, the third bit line is electrically connected to a drain electrode of the stack transistor of the second unit cell, the second bit line is electrically connected to the source electrode of the select transistor of the second unit cell and the drain electrode of the stack transistor of the first unit cell.

2. The programmable memory device as claimed in claim 1, wherein the select gate and the control gate are different portions of the word line, respectively.

3. The programmable memory device as claimed in claim 1, wherein the bit lines are doped regions disposed in the substrate.

4. The programmable memory device as claimed in claim 1, wherein the bit lines and the word lines are perpendicular.

5. The programmable memory device as claimed in claim 1, wherein the programmable memory device is programmed and erased by Fowler-Nordheim tunneling through a tunneling dielectric layer under the floating gate.

* * * * *